(12) United States Patent
Kennedy et al.

(10) Patent No.: US 8,909,498 B2
(45) Date of Patent: Dec. 9, 2014

(54) METHOD AND SYSTEM FOR TESTING AND CALIBRATING AN ACCELEROMETER OF AN ELECTRONIC DEVICE

(71) Applicant: Research In Motion Limited, Waterloo (CA)

(72) Inventors: Marc Adam Kennedy, Kitchener (CA); Arkady Ivannikov, Mississauga (CA); Aleksandar Papo, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 13/909,507

(22) Filed: Jun. 4, 2013

(65) Prior Publication Data

US 2013/0263642 A1  Oct. 10, 2013

Related U.S. Application Data

(62) Division of application No. 12/843,973, filed on Jul. 27, 2010, now Pat. No. 8,626,471.

(60) Provisional application No. 61/229,870, filed on Jul. 30, 2009.

(51) Int. Cl.
| | | |
|---|---|---|
| G01P 15/00 | (2006.01) | |
| G01P 15/18 | (2013.01) | |
| G01P 21/00 | (2006.01) | |
| G01M 7/06 | (2006.01) | |
| G01R 33/24 | (2006.01) | |

(52) U.S. Cl.
CPC .............. *G01P 21/00* (2013.01); *G01P 15/18* (2013.01); *G01M 7/06* (2013.01); *G01R 33/24* (2013.01)
USPC ........... 702/141; 702/104; 702/115; 702/154; 73/1.37; 73/1.38; 73/663

(58) Field of Classification Search
USPC .................................. 73/1.38; 702/141, 154
See application file for complete search history.

(56) References Cited

U.S. PATENT DOCUMENTS 4,975,637 A * 12/1990 Frankeny et al. ........ 324/750.11
5,203,199 A    4/1993 Henderson
(Continued)

FOREIGN PATENT DOCUMENTS

GB    968640 A    9/1964
JP    09251031 A  9/1997

OTHER PUBLICATIONS

NASA, NASA Langley's Multi-Axis Accelerometer Calibration System, http://technologygateway.nasa.gov/docs/TOA_LARC37_MultiAxisAccelerometer_03web.pdf, 2008.

(Continued)

*Primary Examiner* — Sujoy Kundu
*Assistant Examiner* — Paul D Lee
(74) *Attorney, Agent, or Firm* — Ridout & Maybee LLP

(57) ABSTRACT

A method and system for testing and calibrating an accelerometer of an electronic device are provided. In accordance with one embodiment, there is a test system for an electronic device having an accelerometer with three mutually orthogonal sensing axes, the test system comprising: a test fixture having: a nest defining a cavity for receiving an electronic device; wherein the nest is configured so that, when the test fixture is substantially horizontal, a two-dimensional sensing plane defined by two of the sensing axes of the accelerometer is substantially horizontal and the third sensing axis is perpendicular to the two-dimensional sensing plane and substantially parallel to the force of gravity.

11 Claims, 4 Drawing Sheets

(56) References Cited

U.S. PATENT DOCUMENTS

| | | | |
|---|---|---|---|
| 5,258,823 A * | 11/1993 | Akamatsu | 356/615 |
| 5,895,858 A | 4/1999 | Malone et al. | |
| 6,257,265 B1 | 7/2001 | Brunner et al. | |
| 6,674,358 B1 | 1/2004 | Tinsley et al. | |
| 7,117,112 B2 | 10/2006 | Mok | |
| 7,165,003 B2 | 1/2007 | Mok | |
| 7,350,394 B1 | 4/2008 | Flynn | |
| 7,467,536 B2 | 12/2008 | Finley et al. | |
| 7,743,520 B1 * | 6/2010 | Jiorle | 33/366.11 |
| 2004/0007064 A1 | 1/2004 | Sakaguchi | |
| 2005/0251294 A1 | 11/2005 | Cerwin | |
| 2006/0161377 A1 | 7/2006 | Rakkola et al. | |
| 2006/0272413 A1 | 12/2006 | Vaganov et al. | |
| 2007/0150221 A1 | 6/2007 | Babala et al. | |
| 2007/0277586 A1 | 12/2007 | Kamiya | |
| 2008/0132334 A1 | 6/2008 | Nonaka et al. | |
| 2009/0281756 A1 | 11/2009 | Weed et al. | |

OTHER PUBLICATIONS

Office Action; Canadian Patent Application No. 2,711,406; Nov. 29, 2012.

Extended European Search Report; EP10171353.5; Jun. 9, 2011.

English Translation of JP 9-251031; Sep. 22, 1997.

* cited by examiner

METHOD AND SYSTEM FOR TESTING AND CALIBRATING AN ACCELEROMETER OF AN ELECTRONIC DEVICE

RELATED APPLICATION DATA

This application is a divisional of U.S. patent application Ser. No. 12/843,973, filed Jul. 27, 2010 which claims priority to, and the benefit of, provisional U.S. patent application Ser. No. 61/229,870, filed Jul. 30, 2009, the entire content of all of these documents being incorporated herein by reference.

TECHNICAL FIELD

The present disclosure relates generally to accelerometers, and in particular to a method and system for testing and calibrating an accelerometer of an electronic device.

BACKGROUND

Accelerometers, such as Micro-Electro-Mechanical Systems (MEMS) accelerometers, are sometimes incorporated into portable electronic devices for determining the spatial orientation of the device or other uses. The manufacturing process for making accelerometers may result in misalignment of its sensing axes. In addition, the process of assembling an accelerometer into an electronic device often results in the accelerometer being misaligned (e.g., rotated and/or tilted) relative to a target orientation on the circuit board of the host device. Thus, built-in accelerometers may suffer from non-zero pitch and roll effects. Moreover, MEMS accelerometers are subject to a wide array of factors which create random offset errors. For example, heat, axial stress, and the adhesive underfill applied to fix the accelerometer to the circuit board of the portable electronic device may create errors in the differential capacitance measurement of the MEMS sensing part(s).

The improper alignment of a built-in accelerometer and errors in the differential capacitance measurement cause measurement errors in the accelerometer readings. Accordingly, built-in accelerometers typically require testing and calibrating to measure and correct measurement errors such as bias error. Calibration improves user interaction with the portable electronic devices by providing more accurate and repeatable accelerometer output to the operating system and applications of the portable electronic device using the accelerometer. However, the testing and calibrating of built-in accelerometers adds to the cost and time required to produce the host portable electronic devices. Accordingly, there exists a need for methods and systems for efficient testing and calibrating of built-in accelerometers.

BRIEF DESCRIPTION OF THE DRAWINGS

Like reference numerals are used in the drawings to denote like elements and features.

DETAILED DESCRIPTION OF EXAMPLE EMBODIMENTS

Figure 1:
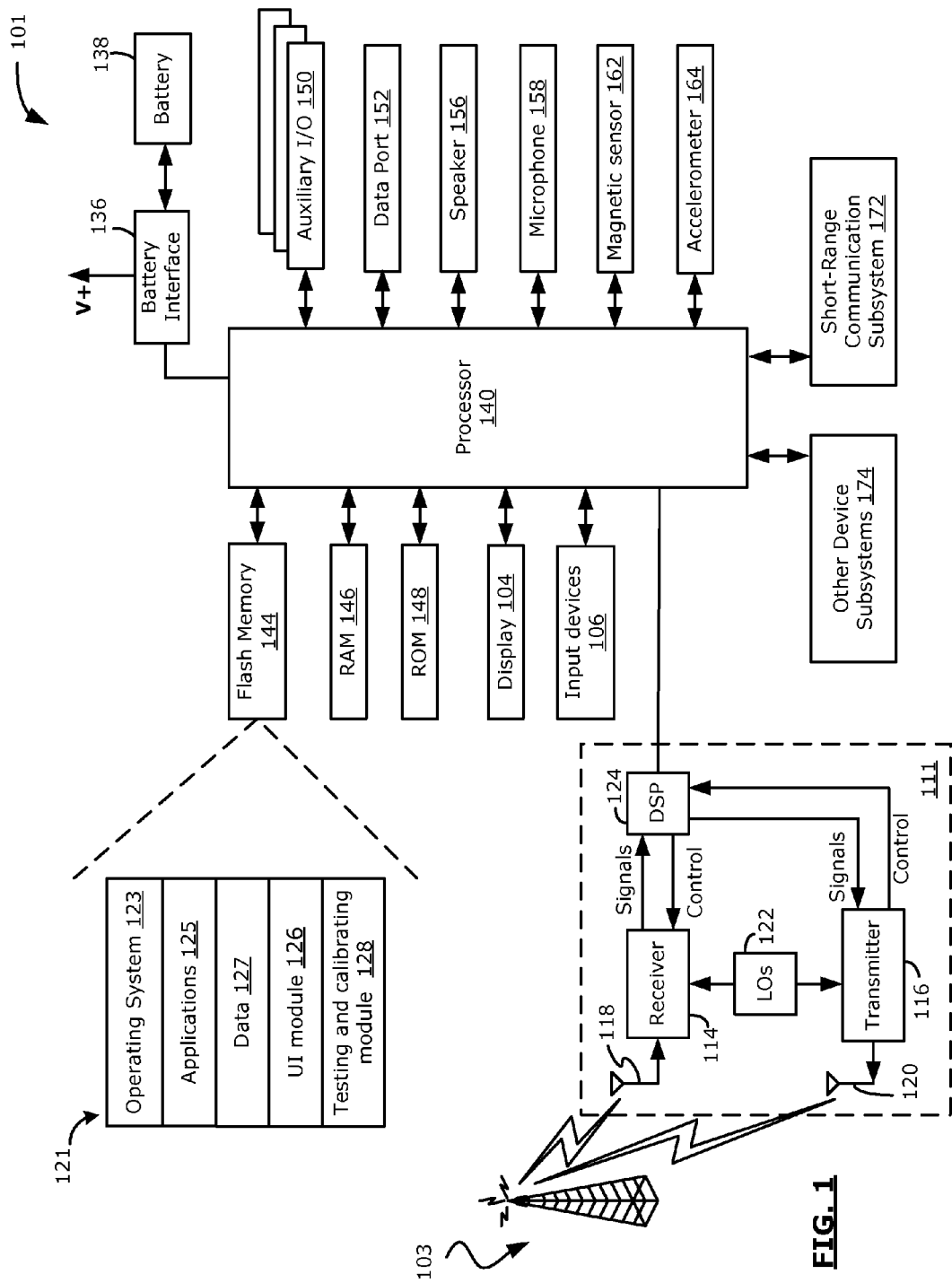
FIG. 1 is a block diagram illustrating a portable electronic device suitable for carrying out example embodiments of the present disclosure.

Conventional methods and systems for testing and calibrating built-in accelerometers require a physical connection between a device under test (DUT) and an external test system for communications between the DUT and external test system. The requirement of physical connection between the DUT and the external test system is not conducive to high-volume manufacturing of electronic devices due to the additional step required to establish this connection and the additional alignment consideration imposed by the physical connection to the external test system. For some applications, each of the sensing axes of the accelerometer must be accurate to less than 1 degree. The physical connection between the DUT and the external test system makes such tolerances more difficult to achieve due to the additional alignment constraints. Moreover, conventional testing and calibrating typically requires orienting the DUT in a series of predefined orientations with respect to the force of gravity. However, it is difficult to repeatedly orient the DUT in the predefined orientations using conventional testing systems and methods. Accordingly, there remains a need for improved methods and systems for testing and calibrating built-in accelerometers.

The present disclosure provides a method and system for testing and calibrating an accelerometer of an electronic device. The system includes a custom test fixture for the DUT and testing and calibration software loaded on the DUT which does not require a physical connection between the DUT and an external test system.

The teachings of the present disclosure relate generally to handheld and other portable electronic devices including but not limited to pagers, cellular phones, Global Positioning System (GPS) navigation devices and other satellite navigation devices, inertial navigation system (INS), smartphones, wireless organizers, personal digital assistants (PDA) with and without wireless communication capabilities, electronic gaming devices, digital photograph albums, digital picture frames, digital cameras, digital music players such as MP3 players, and digital video recorders such as camcorders. These examples are intended to be non-limiting.

In accordance with one embodiment of the present disclosure, there is provided a method of testing and calibrating an accelerometer of an electronic device, comprising: levelling a test fixture; placing the electronic device in a nest of the test fixture; detecting the electronic device within the nest; calculating an offset value for each sensing axis of the accelerometer in response to detecting the electronic device within the nest; and storing the offset values in a memory of the electronic device.

In accordance with another embodiment of the present disclosure, there is provided a test system for an electronic device having an accelerometer with three mutually orthogonal sensing axes, the test system comprising: a test fixture having a nest defining a cavity for receiving an electronic device, wherein the nest is configured so that, when the test fixture is substantially horizontal, a two-dimensional sensing plane defined by two of the sensing axes of the accelerometer is substantially horizontal and the third sensing axis is perpendicular to the two-dimensional sensing plane and substantially parallel to the force of gravity.

In some embodiments, the test system further comprises: a controller; an inclinometer connected to the controller; wherein the controller is configured to determine a levelness of the test fixture using the inclinometer.

In some embodiments, the test system further comprises: an optical switch connected to the controller for detecting when the electronic device is received within the nest of the test fixture, the optical switch informing the controller when the electronic device is received within the nest of the test fixture, wherein the controller is configured to automatically determine the levelness of the test fixture using the inclinometer when informed by the optical switch that the electronic device is received within the nest of the test fixture.

In some embodiments, the test system further comprises a magnetic sensor and the test fixture further comprises an electromagnet configured to generate an electromagnetic field detectable by a magnetic sensor of the electronic device when received within the nest; wherein the controller is configured to activate the electromagnet when informed by the optical switch that the electronic device is received within the nest of the test fixture; wherein the electronic device, in a testing and calibrating mode, is configured to automatically calculate an offset value for each sensing axis of the accelerometer in response to the magnetic sensor of the electronic device detecting the electromagnetic field and store the offset values in a memory of the electronic device. In some embodiments, the optical switch comprises a light source and a sensor located opposite the light source for receiving light emitted from the light source, wherein the light source and sensor are located within the nest such that, when the electronic device is received within the nest, the light emitted by the light source is interrupted and does not reach the sensor.

In some embodiments, the test system further comprises a display connected to the controller, wherein the controller is configured to cause the determined levelness of the test fixture to be displayed on the display.

In some embodiments, the test system further comprises a magnetic sensor and the test fixture further comprises an electromagnet configured to generate an electromagnetic field detectable by a magnetic sensor of the electronic device when received within the nest.

In some embodiments, the electronic device, in a testing and calibrating mode, is configured to automatically calculate an offset value for each sensing axis of the accelerometer in response to the magnetic sensor of the electronic device detecting the electromagnetic field and store the offset values in a memory of the electronic device.

In some embodiments, the electronic device, in the testing and calibrating mode, is configured to: measure acceleration using each sensing axis of the accelerometer for a predetermined duration; determine an average value of the acceleration measurements for each sensing axis of the accelerometer; and store the average value of the acceleration measurements for each sensing axis of the accelerometer as respective offset values in the memory of the electronic device.

In some embodiments, the electronic device, in a measuring mode, is configured for measuring acceleration using each sensing axis of the accelerometer, and adjusting the measured acceleration for each sensing axis of the accelerometer in accordance with the offset values stored in the memory.

In some embodiments, the electronic device, in a measuring mode, is configured for adjusting the measured acceleration by adding the respective offset values to the measured acceleration for each sensing axis of the accelerometer.

In some embodiments, the test system further comprises a plurality of levelling legs for levelling the test fixture.

In accordance with a further embodiment of the present disclosure, there is provided an electronic device, comprising: a controller; an accelerometer with three mutually orthogonal sensing axes connected to the controller; a magnetic sensor connected to the controller; a memory connected to the controller; wherein the controller, in a testing and calibrating mode, is configured to automatically calculate an offset value for each sensing axis of the accelerometer in response to the magnetic sensor detecting an electromagnetic field of a predetermined strength and store the offset values in the memory.

In accordance with yet a further embodiment of the present disclosure, there is provided a computer program product comprising a machine-readable medium having stored thereon machine-executable program instructions for implementing a method on an electronic device which controls its operation, the machine-executable program instructions comprising instructions for performing the method(s) set forth herein.

Reference is first made to FIG. 1 which illustrates a handheld electronic device 101 in which example embodiments described in the present disclosure can be applied. The handheld electronic device 101 of FIG. 1 is a mobile communication device providing two-way data and possibly also voice communication capabilities, and the capability to communicate with other computer systems, for example, via the Internet. However, in other embodiments the handheld electronic device 101 could be one of the other handheld or portable electronic devices mentioned above. Depending on the functionality provided by the handheld electronic device 101, in various embodiments the device 101 may be a data communication device, a multiple-mode communication device configured for both data and voice communication, a smartphone, a mobile telephone or PDA enabled for wireless communication, or a computer system with a wireless modem.

The handheld electronic device 101 includes a controller comprising at least one processor 140 such as a microprocessor which controls the overall operation of the handheld electronic device 101 and a wireless communication subsystem 111 which interacts with the processor 140 and exchanges radio frequency signals with the wireless network 103 to perform communication functions. The communication subsystem 111 includes a receiver 114, a transmitter 116, and associated components, such as one or more antenna elements 118 and 110, local oscillators (LOs) 122, and a processing module such as a digital signal processor (DSP) 114. The antenna elements 118 and 110 may be embedded or internal to the handheld electronic device 101 and a single antenna may be shared by both receiver and transmitter, as is known in the art. As will be apparent to those skilled in the field of communication, the particular design of the wireless communication subsystem 111 depends on the wireless network in which the handheld electronic device 101 is intended to operate.

The handheld electronic device 101 may communicate with any one of a plurality of fixed transceiver base stations (not shown) of the wireless network 103 within its geographic coverage area. The handheld electronic device 101 may send and receive communication signals over the wireless network 103 after a network registration or activation procedures have been completed. Signals received by the antenna 118 through the wireless network 103 are input to the receiver 114, which may perform such common receiver functions as signal amplification, frequency down conversion, filtering, channel selection, etc., as well as analog-to-digital (A/D) conversion. A/D conversion of a received signal allows more complex communication functions such as demodulation and decoding to be performed in the DSP 124. In a similar manner, signals to be transmitted are processed, including modulation and encoding, for example, by the DSP 124. These DSP-processed signals are input to the transmitter 116 for digital-to-analog (D/A) conversion, frequency up conversion, filtering, amplification, and transmission to the wireless network 103 via the antenna 120. The DSP 124 not only processes communication signals, but may also provide for receiver and transmitter control. For example, the gains applied to communication signals in the receiver 114 and the transmitter 116 may be adaptively controlled through automatic gain control algorithms implemented in the DSP 124.

The processor 140 also interacts with additional device subsystems including a display screen 104 (such as a liquid crystal display (LCD) screen) which could be a touchscreen display and input devices 106 such as control buttons or keys. The input devices 106 may also include a keyboard or keypad, navigational input device, or both. The navigational input device could be a clickable/depressible trackball or scrollwheel, or touchpad. These other input devices could be included in addition to, or instead of, a touchscreen display.

The processor 140 interacts with additional device subsystems including flash memory 144, random access memory (RAM) 146, read only memory (ROM) 148, auxiliary input/output (I/O) subsystems 150, data port 152 such as serial data port, speaker 156, microphone 158, magnetic sensor 162 such as a hall effect sensor, accelerometer 164, short-range communication subsystem 172, and other device subsystems generally designated as 174. Some of the subsystems shown in FIG. 1 perform communication-related functions, whereas other subsystems may provide "resident" or on-device functions.

In one example embodiment, the accelerometer 164 is a 3-axis digital accelerometer having three mutually orthogonal sensing axes. The accelerometer 164 comprises a sensing part (not shown) connected to a controller (not shown) via interrupt and serial interfaces. The controller of the accelerometer 164 is connected to the processor 140 of the handheld electronic device 101. The sensing part is a MEMS sensing part in at least some embodiments. The output of the accelerometer 164 is typically measured or represented in terms of the gravitational acceleration constant at the Earth's surface, denoted g, which is approximately 9.81 m/s$^2$ (32.2 ft/s$^2$) as the standard average. In other embodiments, a different digital accelerometer type and/or configuration could be used, or a suitable analog accelerometer and control circuit could be used.

The operation of the accelerometer 164 is controlled by software which may be stored in internal memory of the controller of the accelerometer 164, or possibly in the memory of the handheld electronic device 101. The operation of the accelerometer 164 is controlled using control signals sent by the controller to the sensing part via the serial interface. The controller may determine the orientation of the device 101 in accordance with the acceleration measurements, or raw acceleration data measured by the accelerometer 164 may be sent to the processor 140 of the device 101 via a serial interface. The processor 140 of the device 101 then determines the orientation of the device 101 in accordance with instructions of the operating system 123, UI module 126 or other software module 121.

Figure 2:
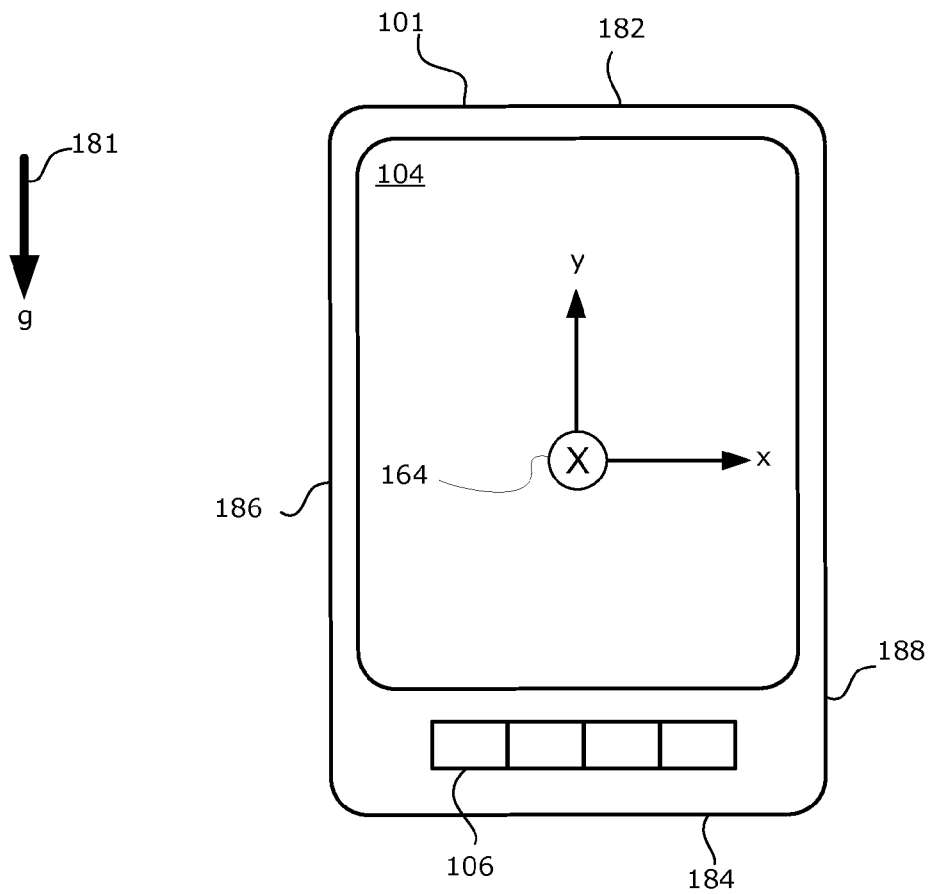
FIG. 2 is a front view of the portable electronic device of FIG. 1.
Figure 3:
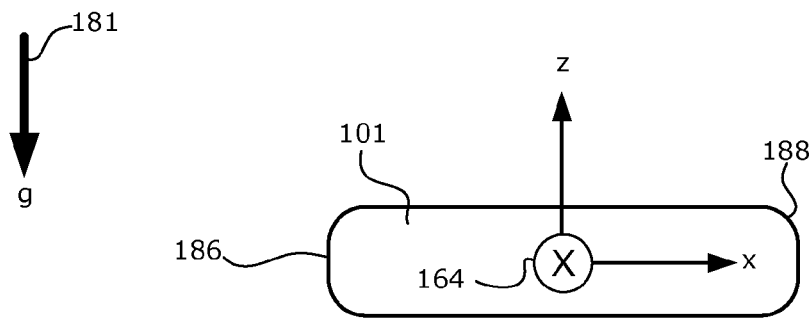
FIG. 3 is a bottom view of the portable electronic device of FIG. 2.

Referring now to FIGS. 2 and 3, the three sensing axes of the accelerometer 164 are denoted "x", "y" and "z". The x-axis and y-axis are aligned with a horizontal plane defined of the handheld electronic device 101 (the surface of the display 104 in the shown embodiment). Accordingly, the x and y sensing axes define an x-y plane of measurement for the accelerometer 164. The z-axis is perpendicular to the x-y plane defined by the x and y-sensing axes of the accelerometer 164. In the shown embodiment, the x-axis is aligned about an axis extending laterally along a midpoint of the device 101 between its top and bottom ends denoted by reference numerals 182 and 184 respectively. The y-axis is aligned about an axis extending longitudinally along a midpoint of the device 101 between the left and right sides denoted by reference numerals 186 and 188 respectively. The z-axis extends perpendicularly through the x-y plane defined by the x and y sensing axes at the intersection (origin) of these axes. It is contemplated that the "x", "y" and "z" axes may be aligned with different features of the handheld electronic device 101 in other embodiments.

When the handheld electronic device 101 is positioned horizontally and the accelerometer 164 is properly calibrated, the z-axis is aligned with the force of gravity denoted by reference numeral 181 in FIGS. 2 and 3 and the z-axis should measure approximately 1 g. The x and y-axes are perpendicular to the force of gravity 181 and so should measure approximately 0 g in this same position. When the handheld electronic device 101 is moved away from the horizontal, the z-axis measurement moves downwards away from the 1 g level and the x and y-axes move upwards away from the 0 g level.

The processor 140 operates under stored program control and executes software modules 121 stored in memory such as persistent memory, for example, in the flash memory 144. As illustrated in FIG. 1, the software modules 121 comprise operating system software 123, software applications 125 comprising a user interface (UI) module 126 and a test and calibration module 128. The user interface module 126 renders and displays the GUI of the device 101 in accordance with instructions of the operating system 123 and applications 125 (as applicable).

The modules 126, 128 may, among other things, each be implemented through standalone software applications, or combined together in one or more of the operating system 123 or other software applications 125. The functions performed by each of the above identified modules 126, 128 may be realized as a plurality of independent elements, rather than a single integrated element, and any one or more of these elements may be implemented as parts of other software applications 125.

Those skilled in the art will appreciate that the software modules 121 or parts thereof may be temporarily loaded into volatile memory such as the RAM 146. The RAM 146 is used for storing runtime data variables and other types of data or information, as will be apparent to those skilled in the art. Although specific functions are described for various types of memory, this is merely one example, and those skilled in the art will appreciate that a different assignment of functions to types of memory could also be used. The handheld electronic device 101 stores data 140 in an erasable persistent memory, which in one example embodiment is the flash memory 144.

The handheld electronic device 101 also includes a battery 138 as a power source, which is typically one or more rechargeable batteries that may be charged, for example, through charging circuitry coupled to a battery interface such as the serial data port 152. The battery 138 provides electrical power to at least some of the electrical circuitry in the handheld electronic device 101, and the battery interface 136 provides a mechanical and electrical connection for the battery 138. The battery interface 136 is coupled to a regulator (not shown) which provides power V+ to the circuitry of the handheld electronic device 101.

The short-range communication subsystem 172 is an additional optional component which provides for communication between the handheld electronic device 101 and different systems or devices, which need not necessarily be similar devices. For example, the subsystem 172 may include an infrared device and associated circuits and components, or a wireless bus protocol compliant communication mechanism such as a Bluetooth® communication module to provide for communication with similarly-enabled systems and devices.

A predetermined set of applications that control basic device operations, including data and possibly voice communication applications will normally be installed on the handheld electronic device 101 during or after manufacture. Additional applications and/or upgrades to the operating system 123 or software applications 125 may also be loaded onto the handheld electronic device 101 through the wireless network 103, the auxiliary I/O subsystem 150, the serial port 152, the short-range communication subsystem 172, or other suitable subsystem 174 other wireless communication interfaces. The downloaded programs or code modules may be permanently installed, for example, written into the program memory (i.e. the flash memory 144), or written into and executed from the RAM 146 for execution by the processor 140 at runtime. Such flexibility in application installation increases the functionality of the handheld electronic device 101 and may provide enhanced on-device functions, communication-related functions, or both. For example, secure communication applications may enable electronic commerce functions and other such financial transactions to be performed using the handheld electronic device 101.

Figure 4:
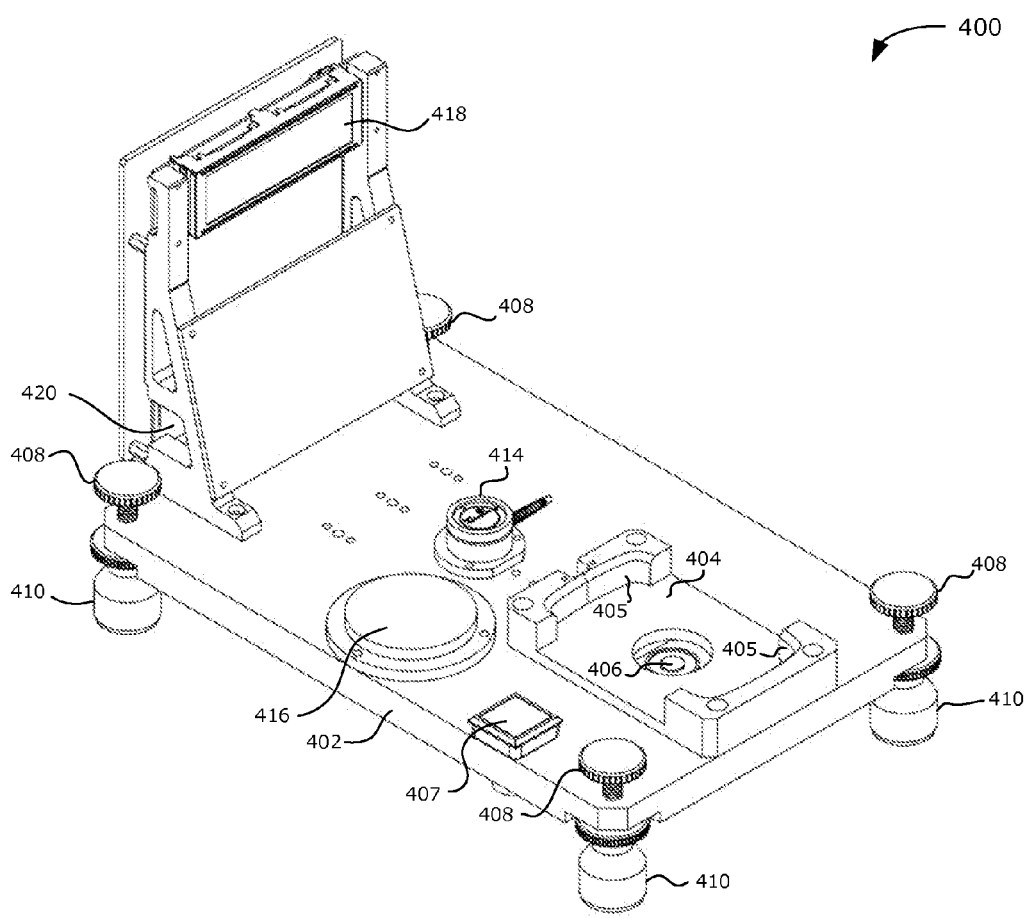
FIG. 4 is a perspective view of a test fixture for testing and calibrating a built-in accelerometer of the portable electronic device of FIG. 1 in accordance with one embodiment of the present disclosure.

Referring now to FIG. 4, a test fixture 400 in accordance with one embodiment of the present disclosure will be described. The test fixture 400 includes a base plate 402, a nest 404 attached to the base plate 402 for receiving a device under test (DUT) such as the handheld electronic device 101, an electromagnet 406 and switch 407, adjustable levelling legs 408, a 2-axis inclinometer 414, a round level (or bubble level) 416, a display 418 such as an LCD display, and a controller 420 connected to the electromagnet 406, switch 407, inclinometer 414 and display 418.

The nest 404 is a custom-fit mold (or partial mold) defining a cavity having one or surfaces 405 which are shaped to facilitate a substantially seamless mate with a housing or case of the handheld electronic device 101. The surfaces 405 are shaped to complimentarily match at least a portion of one or more surfaces on the housing of the handheld electronic device 101. The nest 404 is configured so that, when the test fixture 400 is substantially horizontal (i.e., level with the ground), the x-y sensing plane defined by the x and y sensing axes of the accelerometer 164 are also substantially horizontal.

The nest 404 is shaped to cradle each DUT of the same type in the same position when received within the cavity. It will be appreciated that DUTs having differently shaped housings require different nests custom-fit to the shape of the respective device housings. The nest 404 may be machined from a block of aluminum or other suitable material.

The electromagnet 406 is controlled by the controller 420 which determines whether the base plate 402 of the test fixture 400 is level (and therefore whether the test fixture 400 is itself level). The controller 420 can be used to change the strength of the electromagnetic field generated by the electromagnet 406. The electromagnet 406 is also connected to the switch 407 which can be used to activate and deactivate the electromagnet 406. The switch 407 sends corresponding instructions to the controller 420 to activate and deactivate the electromagnet 406 in response to its activation.

When activated, the electromagnet 406 generates an electromagnetic field of sufficient strength to be detected by the magnetic sensor 162 of the handheld electronic device 101. Outside of the testing and calibrating environment, the magnetic sensor 162 may be used for detecting an appropriately positioned magnet located in a docking cradle or holster of the handheld electronic device 101. Direction of docking or holstering of the handheld electronic device 101 may be used to trigger device events such as powering saving features. As noted above, the magnetic sensor 162 may be a hall effect sensor in some embodiments.

The levelling legs 408 have feet 410 for resting upon a testing bench or other surface and threaded members which can be used to raise and lower the legs 408 to level the fixture 400 on the testing bench or other surface upon which it is located. In the shown embodiment, the adjustable levelling legs 408 are located in each of the corners of the test fixture 400. In other embodiments, levelling means other than levelling legs 408 could be used.

Figure 5:
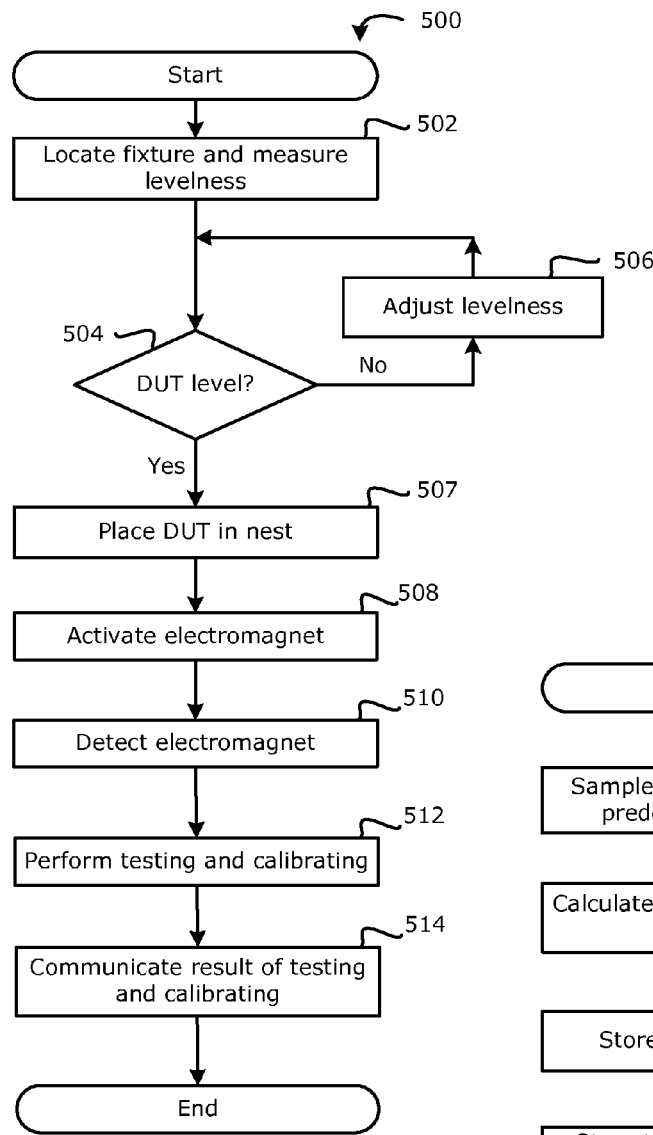
FIG. 5 is a flowchart illustrating an example process for testing and calibrating a built-in accelerometer of the portable electronic device of FIG. 1 in accordance with one embodiment of the present disclosure.

Referring now to FIG. 5, an example process 500 for testing and calibrating a built-in accelerometer 164 of a DUT such as the handheld electronic device 101 in accordance with one embodiment of the present disclosure will be described.

In the first step 502, the test fixture 400 is located on a test bench or other working surface and measurements are taken with the 2-axis inclinometer 414 to determine whether the test fixture 400 is level within specified limits (or tolerances). It will be appreciated that when the test fixture 400 is level, the handheld electronic device 101 is aligned with the force of gravity 181 (see FIGS. 2 and 3). If the test fixture 400 is level within the specified limits, processing proceeds to step 507. If the test fixture 400 is not level within the specified limits, processing proceeds to step 504.

The 2-axis inclinometer 414 measures the tilt angles of the test fixture 400 and sends the measured tilt angles (for example, in terms of x and y-coordinates) to the controller 420. The controller 420 displays the measured tilt angles on the display 418 (for example, in terms of +/−x and +/−y) and compares the measured tilt angles to pre-programmed limits. The round level 416 provides a visual indication to the operator of the direction(s) in which the test fixture 400 is not level. This visual indication supplements the tilt angles measured by the inclinometer 414 and displayed on the display 418. This provides a more intuitive reference for the operator during the levelling process. In other embodiments, the level 416 could be omitted.

The controller 420 determines the levelness of the base plate 402 and test fixture 400 via the measured tilt angles and communicates the status of the levelness of the test fixture 400 to the operator via the display 418. The status of the levelness could be communicated in any suitable way including displaying an appropriate text message on the display 418, or changing a colour and/or graphics displayed on the display 418. In one example embodiment, the background colour of the display 418 turns red when the test fixture 400 is not level and turns green when the test fixture 400 is level. The measured tilt angles may also be displayed to the operator via the display 418 (e.g., LCD display) at this time.

In some embodiments, the test fixture 400 may also include an optical switch (not shown) connected to the controller 420 which detects when the handheld electronic device 101 is received within the nest 404 of the test fixture 400. As will be known to persons skilled in the art, the optical switch includes a light source such as a laser, and a sensor located opposite the light source which receives light emitted from it. The sensor and light source are located within the nest 404 such that, when the handheld electronic device 101 is properly received within the nest 404, the light emitted by the light source is interrupted and does not reach the sensor. The interruption in light emitted by the light source is detected by the sensor. The sensor then informs the controller 420 that the handheld electronic device 101 is received within the nest 404 of the test fixture 400. The detection of an interruption in light emitted by the light source may automatically trigger the controller 420 to test the levelness of the test fixture 400 in step 504. An automated trigger for testing the levelness of the test fixture 400 reduces operator interaction with the handheld electronic device 101, thereby reducing testing and calibrating time. The detection of an interruption in light emitted by the light source may also prevent the electromagnet 406 from being activated (manually or automatically) because the handheld electronic device 101 is not within the nest 404. The detection of an interruption in light emitted may be used to perform one or both of the above-described functions, depending on the embodiment.

In other embodiments, the levelness of the test fixture 400 could be determined manually by the operator rather than being performed automatically as described above.

It will be appreciated that the test fixture 400 is levelled when it is first setup, and whenever the test fixture 400 is moved. After the test fixture 400 has been levelled, the testing of manufactured handheld electronic devices 101 in high volumes can commence.

If the test fixture 400 is not level, the process 500 proceeds to step 506 where one or more levelling legs 408 are adjusted (raised or lowered) as required until the test fixture 400 is level within the specified limits. Typically the adjustment of the levelling legs 408 is done manually by the operator but could be automated in some embodiments. After the test fixture 400 is levelled, processing proceeds to step 507.

Next, in step 507 a handheld electronic device 101 is placed within the nest 404 of the test fixture 400. It will be appreciated that the device 101 could be placed in nest 404 before the test fixture 400 is levelled. After the initial levelling, the test fixture 400 should not have to be levelled again unless it is moved.

Next, in step 508 the electromagnet 406 is activated, thereby generating an electromagnetic field below the nest 404. The electromagnet 406 is typically activated manually by the operator (for example, by depressing the switch 407). However, in some embodiments the electromagnet 406 could be activated automatically by the controller 420 in response to it determining that the handheld electronic device 101 is received in the nest 404 (via the optical switch) and the test fixture 400 is level within the specified limits (via the inclinometer 414 and possibly the level 416).

Next, in step 510 the electromagnetic field generated by the electromagnet 406 is detected by the handheld electronic device 101 using the magnetic sensor 162. The magnetic sensor 162 is configured to detect an electromagnetic field of a predetermined strength, or an electromagnetic field greater than or equal to a predetermined electromagnetic threshold depending on the embodiment. The strength of the electromagnetic field generated by the electromagnet 406 can be adjusted via the controller 420 based on the magnetic sensor 162 of the handheld electronic device 101.

Next, in step 512 detection of the electromagnetic field by the handheld electronic device 101 triggers a testing and calibrating subroutine for the accelerometer 164. Advantageously, the activation of the electromagnet 406 and its subsequent detection provide a contactless trigger event for initiating the testing and calibrating subroutine. The contactless trigger event further reduces operator interaction with the handheld electronic device 101, thereby reducing testing and calibrating time.

Figure 6:
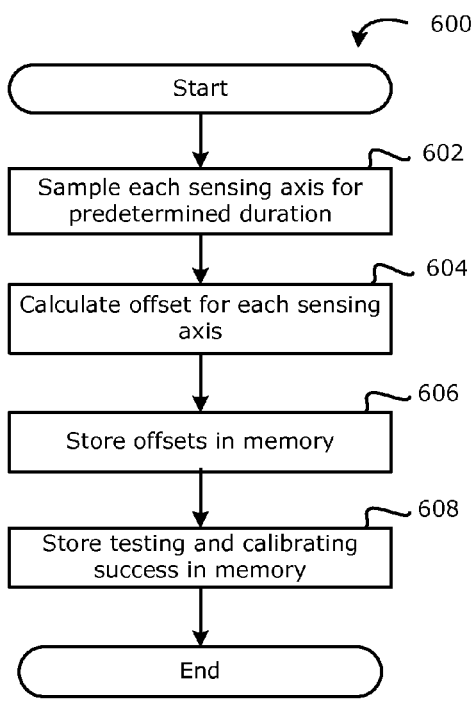
FIG. 6 is a flowchart illustrating an example testing and calibrating subroutine for a built-in accelerometer of the portable electronic device of FIG. 1 in accordance with one embodiment of the present disclosure.

Referring now to FIG. 6, an example testing and calibrating subroutine 600 for the accelerometer 164 in accordance with one embodiment of the present disclosure will be described. The testing and calibrating subroutine 600 is performed by the processor 140 of the handheld electronic device 101 under the instruction of the test and calibration module 128 stored on the device 101. The test and calibration module 128 is configured to implement a test and calibration mode on the handheld electronic device 101.

In the first step 602, raw acceleration data is measured by the accelerometer 164 using each of the three-axis sensing axes for a predetermined duration. An average of the measured acceleration data is then calculated based on the acceleration measurements taken over the predetermined duration. As mentioned above, when positioned horizontally within the test fixture 400, the device 101 should measure the following when the accelerometer 164 is properly calibrated:

| Sensing Axis | Measurement (mg, thousandths of g) | Measurement (Volts) |
| --- | --- | --- |
| x-axis | 0 mg | $V_{dd}/2$ |
| y-axis | 0 mg | $V_{dd}/2$ |
| z-axis | 1000 mg or −1000 mg (depending on the orientation of the accelerometer 164) | $V_{dd}/2 + S * 1\,g$ or $V_{dd}/2 + S * -1\,g$ (depending on the orientation of the accelerometer 164) | where $V_{dd}$ is the voltage supply to the accelerometer 164, for example, from the device battery, and S is a scale factor (or sensitivity) of the accelerometer 164 measured in Volts/g.

With the sensing axis configuration described above and the device 101 positioned horizontally, the accelerometer 164 should output the ideal 0 g output voltage on the x-axis and y-axis, and the ideal +1 g output voltage on the z-axis when there is no bias error. However, the accelerometer 164 typically reads something different than the ideal output when the device 101 is perfectly horizontal. Bias error is the difference between the ideal x, y, z axis output, e.g. (0, 0, 1 g) or (0, 0, −1 g) respectively, and the actual x, y, z axis output of the accelerometer 164. Bias error may be the result of any number of factors including mechanical tolerances in the component parts (printed circuit board, screws, standoffs, solder pads, etc.) of the accelerometer 164 and/or its installation in the device 101.

To calibrate each sensing axis of the accelerometer 164, in step 604 an offset is calculated in accordance with the following equations (1) to (3):

$$\text{Offset}_x = 0\,\text{mg} - A_x \tag{1}$$

$$\text{Offset}_y = 0\,\text{mg} - A_y \tag{2}$$

$$\text{Offset}_z = 1000\,\text{mg} - A_z \tag{3}$$

where $\text{Offset}_x$, $\text{Offset}_y$, and $\text{Offset}_z$ are the offsets for the x, y and z-axes respectively, and $A_x$, $A_y$ and $A_z$ are the average acceleration measurements over the predetermined duration for the x, y and z-axes respectively.

Next, in step 606 the offset values for each sensing axis are stored in non-volatile memory (e.g. flash memory 244) of the handheld electronic device 101, or possibly an onboard memory of the accelerometer 164. The handheld electronic device 101 then verifies that the offsets are stored for each of the three-axis sensing axes of the accelerometer 164. The handheld electronic device 101 then measures raw acceleration data using the accelerometer 164 using each of the three-axis sensing axes and corrects the raw acceleration data with the stored offsets. The handheld electronic device 101 then verifies that the corrected outputs are within a predetermined limit (or tolerance) of the ideal outputs described above.

Next, in step 608 an indication that the accelerometer 164 has been tested and calibrated is then stored in non-volatile memory of the handheld electronic device 101. The indication could be a bit value recognized by other testing software for the device 101, or any other suitable data representation. The indication may be used by other testing software to confirm that the accelerometer 164 has been tested and calibrated, for example, as part of a larger set of testing after the production of the device 101. In other embodiments, the storing of an indication that the accelerometer 164 has been tested and calibrated could be omitted.

Referring again to FIG. 5, in step 514 the handheld electronic device 101 that communicates the testing and calibration has been completed and was successful to the operator. In some embodiments, the handheld electronic device 101 changes the colour of the display screen 104 to green and/or displays a text message indicating that the testing and calibration is complete and was successful. The handheld electronic device 101 may then undergo further testing, or testing could be complete and the device 101 may be put into an operational mode which uses the accelerometer 164 for measuring.

If there was an error during the testing and calibrating subroutine 600, then a corresponding communication about the error is provided. In some embodiments, the handheld electronic device 101 changes the colour of the display screen 104 to red and/or displays a text message indicating that the testing and calibration was not successful. The testing and calibrating process 500 may then be repeated until the testing and calibration is completed and successful.

When the handheld electronic device 101 is in an operational mode which uses the accelerometer 164 for measuring as opposed to the test and calibration mode, the offsets stored in memory are used to correct measurements taken by the accelerometer 164. Typically, the correction is performed by the operating system 223 and the corrected acceleration value is passed to the UI module 226, an active application 225 or other software module 221 for further processing. The corrected acceleration value can be used for any purpose including, but not limited to, determining the spatial orientation of the handheld electronic device 101. The corrected acceleration values at least partial correct for bias errors, thereby improving the accuracy of acceleration measurements. Correction acceleration values for each sensing axis are calculated in accordance with the following equations (4) to (6):

$$X_{corrected} = A_x + \text{Offset}_x \quad (4)$$

$$Y_{corrected} = A_y + \text{Offset}_y \quad (5)$$

$$Z_{corrected} = A_z + \text{Offset}_z \quad (6)$$

where $X_{corrected}$, $Y_{corrected}$, and $Z_{corrected}$ are the correction acceleration measurement values for the x, y and z-axes respectively.

In accordance with some embodiments of the present disclosure, the testing and calibrating process 500 may be part of an interactive test stage of a method for testing portable electronic devices in a production line for the assembly of the devices. The method separates device tests into an interactive test stage in which mechanical/interactive tests are performed on interactive components of the devices, and a non-interactive test stage in which non-mechanical/interactive tests are performed on the devices. Interactive tests are tests which require physical actuation or mechanical dynamics to be performed on devices or device components (e.g., key presses, holstering of the DUT, etc.) to acquire a measurement or achieve a result. Non-interactive tests do not involve physical actuation or mechanical dynamics to be performed on devices or device components to acquire a measurement or achieve a result (e.g., checking the radio of the wireless communication subsystem 111).

While the present disclosure is primarily directed to a three-axis accelerometer built-in to a portable electronic device, it will be appreciated that accelerometers having one or two sensing axes could be tested and calibrated using the same or a similar test fixture and method. Similarly, a portable electronic device having multiple accelerometers could be tested and calibrated using a similar test fixture and method.

The present disclosure may be embodied in other specific forms without departing from its spirit or essential characteristics. The described embodiments are to be considered in all respects as being only illustrative and not restrictive. The present disclosure intends to cover and embrace all suitable changes in technology. The scope of the present disclosure is, therefore, described by the appended claims rather than by the foregoing description. All changes that come within the meaning and range of equivalency of the claims are intended to be embraced within their scope.

The invention claimed is:

1. A test system for an electronic device having an accelerometer with three mutually orthogonal sensing axes, the test system comprising:
   a test fixture having:
      a nest defining a cavity for receiving an electronic device;
      an electromagnet configured to generate an electromagnetic field detectable by a magnetic sensor of the electronic device when received within the nest;
      wherein the nest is configured so that, when the test fixture is substantially horizontal, a two-dimensional sensing plane defined by two of the sensing axes of the accelerometer is substantially horizontal and the third sensing axis is perpendicular to the two-dimensional sensing plane and substantially parallel to the force of gravity.

2. The test system of claim 1, wherein a controller is configured to activate the electromagnet when informed by an optical switch that the electronic device is received within the nest of the test fixture.

3. The test system of claim 1, further comprising:
   a controller;
   an inclinometer connected to the controller;
   wherein the controller is configured to determine a levelness of the test fixture using the inclinometer.

4. The test system of claim 3, further comprising:
   an optical switch connected to the controller for detecting when the electronic device is received within the nest of the test fixture, the optical switch informing the controller when the electronic device is received within the nest of the test fixture,
   wherein the controller is configured to automatically determine the levelness of the test fixture using the inclinometer when informed by the optical switch that the electronic device is received within the nest of the test fixture.

5. The test system of claim 3, wherein the optical switch comprises a light source and a sensor located opposite the light source for receiving light emitted from the light source, wherein the light source and sensor are located within the nest such that, when the electronic device is received within the nest, the light emitted by the light source is interrupted and does not reach the sensor.

6. The test system of claim 3, further comprising a display connected to the controller, wherein the controller is configured to cause the determined levelness of the test fixture to be displayed on the display.

7. The test system of claim 1, wherein the electronic device, in a testing and calibrating mode, is configured to automatically calculate an offset value for each sensing axis of the accelerometer in response to the magnetic sensor of the electronic device detecting the electromagnetic field and store the offset values in a memory of the electronic device.

8. The test system of claim 1, wherein the electronic device, in a testing and calibrating mode, is configured to: measure acceleration using each sensing axis of the accelerometer for a predetermined duration; determine an average value of the acceleration measurements for each sensing axis of the accelerometer; and store the average value of the acceleration measurements for each sensing axis of the accelerometer as respective offset values in the memory of the electronic device.

9. The test system of claim 1, wherein the electronic device, in a measuring mode, is configured for measuring acceleration using each sensing axis of the accelerometer, and adjusting the measured acceleration for each sensing axis of the accelerometer in accordance with the respective offset values stored in the memory of the electronic device.

10. The test system of claim 9, wherein the electronic device, in the measuring mode, is configured for adjusting the measured acceleration by adding the respective offset values to the measured acceleration for each sensing axis of the accelerometer.

11. The test system of claim 1, further comprising a plurality of levelling legs for levelling the test fixture.

* * * * *